(12) United States Patent
Nakamura

(10) Patent No.: US 11,597,875 B2
(45) Date of Patent: Mar. 7, 2023

(54) WAVELENGTH CONVERTER

(71) Applicant: Panasonic Intellectual Property Management Co., Ltd., Osaka (JP)

(72) Inventor: Masahiro Nakamura, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 450 days.

(21) Appl. No.: 16/755,018

(22) PCT Filed: Oct. 18, 2018

(86) PCT No.: PCT/JP2018/038849
§ 371 (c)(1),
(2) Date: Apr. 9, 2020

(87) PCT Pub. No.: WO2019/078299
PCT Pub. Date: Apr. 25, 2019

(65) Prior Publication Data
US 2020/0347290 A1    Nov. 5, 2020

(30) Foreign Application Priority Data
Oct. 19, 2017 (JP) .............................. JP2017-202624

(51) Int. Cl.
*C09K 11/02* (2006.01)
*C09K 11/08* (2006.01)
(Continued)

(52) U.S. Cl.
CPC .......... *C09K 11/02* (2013.01); *C09K 11/0883* (2013.01); *C09K 11/7706* (2013.01); *G02B 5/0242* (2013.01); *G02B 5/0294* (2013.01)

(58) Field of Classification Search
CPC ..................................................... C09K 11/02
See application file for complete search history.

(56) References Cited

U.S. PATENT DOCUMENTS 8,854,725 B2   10/2014  Hamada
2013/0335989 A1  12/2013  Sato
(Continued)

FOREIGN PATENT DOCUMENTS

JP    2016-72252 A    5/2016
JP    2016-204563 A   12/2016
(Continued)

OTHER PUBLICATIONS

International Search Report for corresponding Application No. PCT/JP2018/038849, dated Jan. 22, 2019.
(Continued)

*Primary Examiner* — Vip Patel
(74) *Attorney, Agent, or Firm* — Renner, Otto, Boisselle & Sklar, LLP

(57) ABSTRACT

A wavelength converter includes: a substrate portion; and an optical conversion layer including optical conversion inorganic particles and a binder portion that mutually holds the optical conversion inorganic particles, and being formed on the substrate portion, wherein the substrate portion and the binder portion bond to each other, and wherein the binder portion includes, as a main component, an inorganic polycrystalline substance composed in such a manner that inorganic material particles having an average particle size of 1 μm or less are bound to one another, and has thermal conductivity of 2 w/mK or more.

10 Claims, 5 Drawing Sheets

(51) Int. Cl.
*C09K 11/77* (2006.01)
*G02B 5/02* (2006.01)

(56) References Cited

U.S. PATENT DOCUMENTS

| | | |
|---|---|---|
| 2017/0092786 A1 | 3/2017 | Newell |
| 2017/0199315 A1 | 7/2017 | Yonemoto |
| 2018/0275324 A1 | 9/2018 | Fujita |

FOREIGN PATENT DOCUMENTS

| | | |
|---|---|---|
| JP | 2017-173370 A | 9/2017 |
| WO | 2012/121343 A1 | 9/2012 |
| WO | 2013/172025 A1 | 11/2013 |
| WO | 2017/053747 A1 | 3/2017 |
| WO | 2017/098963 A1 | 6/2017 |

OTHER PUBLICATIONS

Written Opinion for corresponding Application No. PCT/JP2018/038849, dated Jan. 22, 2019.

WAVELENGTH CONVERTER

TECHNICAL FIELD

The present disclosure relates to a wavelength converter using photoluminescence.

BACKGROUND ART

Heretofore, as an optical conversion layer using photoluminescence, there has been known an optical conversion layer composed of: a plurality of optical conversion inorganic particles which emit light by being irradiated with excitation light; and a binder portion that holds the plurality of optical conversion inorganic particles. Usually, the optical conversion layer is formed on a substrate, whereby a wavelength converter including the substrate and the optical conversion layer is obtained. As excitation light, for example, there is used excitation light emitted from a light emitting diode (LED) or a semiconductor laser (LD) as an excitation light source. Between these, the excitation light of the semiconductor laser as a high power density, and accordingly, the semiconductor laser is suitable for the case where it is desired to increase a light output.

In the case of using the excitation light that is applied from the semiconductor laser or the like and has a high power density, a component of the excitation light, which is not converted into fluorescence, sometimes raises a temperature of the optical conversion inorganic particles, and decreases light emission characteristics of the optical conversion inorganic particles (causes temperature quenching). Therefore, it is desired that a binder portion that holds the optical conversion inorganic particles have high thermal conductivity. As such a binder having a high thermal conductivity, aluminum nitride (AlN) and zinc oxide (ZnO) are known.

Meanwhile, it is also desired that the optical conversion layer increase light extraction efficiency from the optical conversion layer. In order to increase the light extraction efficiency from the optical conversion layer, it is preferable that a refractive index of the binder portion be small, and that a refractive index of the optical conversion inorganic particles be large. Moreover, with regard to the excitation light having a high power density, it is preferable that a radiation amount thereof from the optical conversion layer be small from viewpoints of preventing a deterioration of an object and keeping health of a viewer. Therefore, it is preferable that the optical conversion inorganic particles in the optical conversion layer scatter light largely in order to suppress radiation of the excitation light.

Between the binders described above, aluminum nitride is not preferable since a refractive index thereof is as large as 1.9 to 2.2, leading to low light extraction efficiency. Meanwhile, a refractive index of zinc oxide is as small as 1.9 to 2.0. However, in the prior art, it has been necessary to set an average particle size of the inorganic material particles to 1 µm or more in order to improve the thermal conductivity of zinc oxide, and there has been a problem that such zinc oxide scatters light less.

Note that, in PTL 1, a light emitting device is disclosed, which efficiently radiates heat generated in a light emitting body. Specifically, in PTL 1, a light emitting device is disclosed, in which a gap layer that conducts heat between the light emitting body including the optical conversion inorganic particles and a heat conducting member made of sapphire or the like, and this gap layer includes an inorganic amorphous material.

CITATION LIST

Patent Literature

PTL 1: International Publication No. WO 2012/121343

SUMMARY OF INVENTION

Technical Problem

However, in PTL 1, when the heat conducting member and a light emitting portion are bonded to each other by the gap layer, heating thereof is performed to 200° C. to 700° C., and accordingly, there has been a problem that the optical conversion inorganic particles and the heat conducting member are liable to deteriorate by heat. For example, in the case where the heat conducting member is a metal substrate, the metal substrate is liable to deteriorate in such heat treatment as described above. As described above, heretofore, a wavelength converter that has high thermal conductivity and scatters light largely has not been known.

The present disclosure has been made in consideration of the above-described problem. It is an object of the present disclosure to provide a wavelength converter that has high thermal conductivity and scatters light largely.

Solution to Problem

In order to solve the above-described problem, a wavelength converter according to an aspect of the present disclosure includes: a substrate portion; and an optical conversion layer including optical conversion inorganic particles and a binder portion that mutually holds the optical conversion inorganic particles, and being formed on the substrate portion, wherein the substrate portion and the binder portion bond to each other, and wherein the binder portion includes, as a main component, an inorganic polycrystalline substance composed in such a manner that inorganic material particles having an average particle size of 1 µm or less are bound to one another, and has thermal conductivity of 2 w/mK or more.

DESCRIPTION OF EMBODIMENTS

Hereinafter, wavelength converters according to embodiments will be described with reference to the drawings.

First Embodiment

Figure 1:
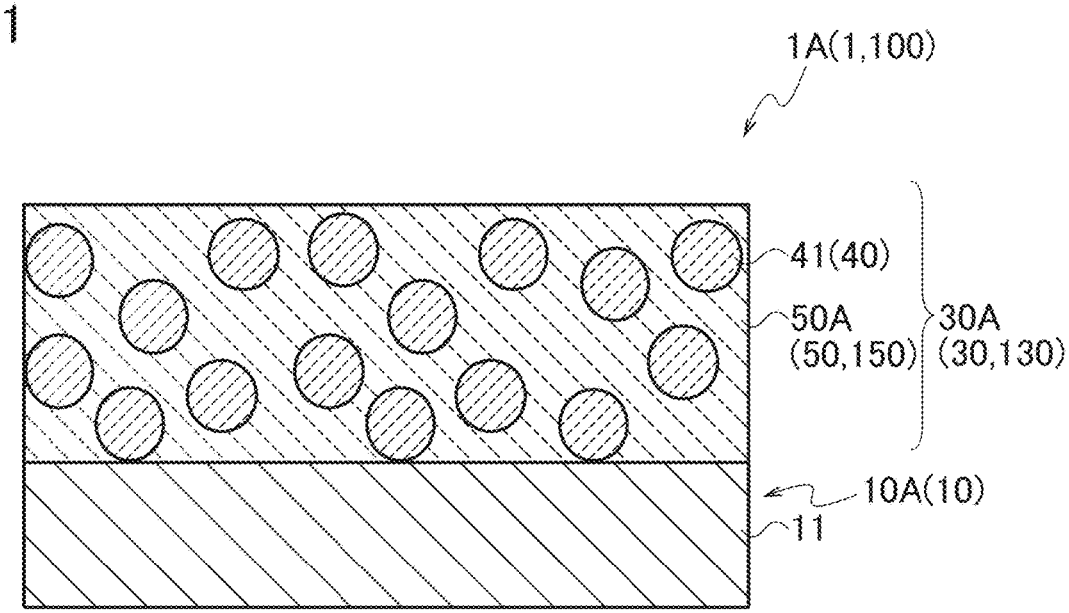
FIG. 1 is a schematic cross-sectional view of a wavelength converter 1A according to a first embodiment and Example 1 and a wavelength converter 100 according to a Comparative example 1.

FIG. 1 is a schematic cross-sectional view of a wavelength converter 1A according to a first embodiment and Example 1 and a wavelength converter 100 according to a Comparative example 1. Note that a wavelength converter according to the first embodiment and a wavelength converter according to Example 1 to be described later have configurations similar to each other, and accordingly, are both illustrated as the wavelength converter 1A. Moreover, the wavelength converter 100 according to Comparative example 1 to be described later and the wavelength converter 1A according to the first embodiment and Example 1 are similar to each other except microscopic structures of binder portions 50 and 150, and accordingly, the wavelength converter 100 according to Comparative example 1 is also illustrated in FIG. 1 together therewith.

As illustrated in FIG. 1, the wavelength converter 1A according to the first embodiment includes a substrate portion 10A (10), and an optical conversion layer 30A (30) formed on the substrate portion 10A.

<Substrate Portion>

The substrate portion 10A is composed of only a substrate body 11. Therefore, the substrate portion 10A is the same as the substrate body 11. Note that, in a wavelength converter according to another embodiment than the wavelength converter 1A, the substrate portion 10 may be configured to include a light reflecting film 12 and a protective film 13 in addition to the substrate body 11. A wavelength converter 1 including the substrate portion 10 configured as above will be described in an embodiment to be described later.

The substrate body 11 is a member that has functions to reinforce an optical conversion layer 30A formed on a surface of the substrate portion 10A, and to impart good optical and thermal characteristics to the optical conversion layer 30A by selection of a material and thickness thereof.

As a material of the substrate body 11, for example, there are used metal that is not translucent and translucent ceramics such as glass and sapphire. As the metal, for example, aluminum, copper or the like is used. The substrate body 11 made of metal is preferable since light reflectivity thereof is excellent. Moreover, the substrate body 11 made of ceramics is preferable since translucency thereof is excellent.

It is preferable that the material of the substrate body 11 be metal since it is easy to improve heat dissipation. That is, if the material of the substrate body 11 is metal, then thermal conductivity of the substrate body 11 increases. Accordingly, in the optical conversion layer 30A, it becomes possible to efficiently remove heat generated in a process where excitation light is converted to fluorescent light 70, and the like. Therefore, it is preferable that the material of the substrate body 11 be metal since it is easy to suppress temperature quenching of optical conversion inorganic particles 40 and degradation and burning of a binder portion 50A. Since the substrate portion 10A is composed of only the substrate body 11, the fact that the material of the substrate body 11 is metal is equivalent to the fact that the substrate portion 10A is made of metal. Therefore, it is preferable that the substrate portion 10A be made of metal since it is easy to suppress the temperature quenching of the optical conversion inorganic particles 40 and the degradation and burning of the binder portion 50A.

Meanwhile, in the case where the material of the substrate body 11 is a translucent material such as translucent ceramics, it becomes possible to apply light to the optical conversion inorganic particles 40 in the optical conversion layer 30A via the substrate portion 10A composed of the substrate body 11. Herein, the fact that a material is translucent means that the material is transparent with respect to the visible light (with a wavelength of 380 nm to 800 nm). Moreover, in this embodiment, being transparent means that light transmittance in a material is preferably 80% or more, more preferably 90% or more. Moreover, it is preferable that an extinction coefficient for the visible light by the material for use in the substrate body 11 be as low as possible since it is possible to sufficiently apply light via the substrate body 11 to the optical conversion inorganic particles 40 in the optical conversion layer 30A. As described above, it is preferable that the substrate body 11 be made of a translucent material since it becomes easy to construct a compact system. As described above, it is preferable that the substrate portion 10A be translucent since it becomes easy to construct a compact system.

Incidentally, the above-described metal usually has lower heat resistance than the above-described ceramics. Therefore, in the case where the substrate portion 10A, that is, the substrate body 11 is made of metal, it is preferable that the substrate body 11 not be heated at a high temperature when the optical conversion layer 30A is provided on the surface thereof. The optical conversion layer 30A of the wavelength converter 1A contains, as a main component, an inorganic polycrystalline substance 52 composed of a dilute-acid pressed inorganic sintered body sinterable at a low temperature as will be described later, and is formable at a relatively low temperature. Therefore, the wavelength converter 1A is preferable in the case where the substrate portion 10A is made of metal.

It is preferable that reflectance of a surface of the substrate portion 10A, which is closer to the optical conversion layer 30A, be 90% or more since extraction efficiency of light from the surface of the optical conversion layer 30A is increased. In order to set the reflectance of the surface of the substrate portion 10A, which is closer to the optical conversion layer 30A, to 90% or more, for example, a method using the substrate portion 10 made of metal is mentioned.

<Optical Conversion Layer>

The optical conversion layer 30A includes the optical conversion inorganic particles 41 (40) and the binder portion 50A (50) that mutually holds the optical conversion inorganic particles 40, and is formed on the substrate portion 10A. A film thickness of the optical conversion layer 30A is, for example, 10 μm to 1000 μm. It is preferable that the film thickness of the optical conversion layer 30A stay within the above-described range since the obtained wavelength converter becomes one that has high thermal conductivity and light extraction efficiency and scatters light largely.

In the optical conversion layer 30A, the optical conversion inorganic particles 41 mean optical conversion inorganic particles having a large particle size among the optical conversion inorganic particles 40. As illustrated in FIG. 1, in the optical conversion layer 30A, as the optical conversion inorganic particles 40, only the optical conversion inorganic particles 41 having a large particle size are included, and optical conversion inorganic particles having a smaller particle size than the optical conversion inorganic particles 41 are not included. However, in the wavelength converter according to another embodiment than the wavelength converter 1A, it is also possible to form such an optical conversion layer 30 including, as the optical conversion inorganic particles 40, optical conversion inorganic particles 42 having a smaller particle size than the optical conversion inorganic particles 41 in addition to the optical conversion inorganic particles 41 having a large particle size. In a wavelength converter according to this embodiment, the optical conversion inorganic particles 40 become those including the optical conversion inorganic particles 41 having a large particle size and the optical conversion inorganic particles 42 having a small particle size. Such a wavelength converter 1 provided with the optical conversion layer 30 configured as above will be described in the embodiment to be described later.

Note that, in the optical conversion layer 30A illustrated in FIG. 1, the optical conversion inorganic particles 40 are composed of only the optical conversion inorganic particles 41 having a large particle size, and accordingly, the optical conversion inorganic particles 40 and the optical conversion inorganic particles 41 having a large particle size are the same, and it is not necessary to distinguish both from each other by reference numerals. However, in the embodiment to be described later, the wavelength converter 1 is illustrated, which is provided with the optical conversion layer 30 including the optical conversion inorganic particles 41 having a large particle size and the optical conversion inorganic particles 42 having a small particle size. For convenience of comparison with the wavelength converter 1 provided with the optical conversion layer 30 including such optical conversion inorganic particles 42 having a small particle size, the optical conversion inorganic particles 40 are also represented as the optical conversion inorganic particles 41 having a large particle size in the optical conversion layer 30A illustrated in FIG. 1.

[Optical Conversion Inorganic Particle]

The optical conversion inorganic particles 40 are particles made of an optical conversion material that is an inorganic compound capable of photoluminescence. A type of the optical conversion inorganic particles 40 is not particularly limited as long as the optical conversion inorganic particles 40 are capable of photoluminescence. As the optical conversion inorganic particles, for example, used are particles containing a nitride-based optical conversion material activated by $Eu^{2+}$, and particles made of YAG, that is, particles with a garnet structure made of $Y_3Al_5O_{12}$. Among optical conversion inorganic particles, the particles containing the nitride-based optical conversion material activated by $Eu^{2+}$ are preferable since the excitation light is converted to light with a longer wavelength. Moreover, as the particles containing the nitride-based optical conversion material activated by $Eu^{2+}$, for example, used are optical conversion inorganic particles containing $(Sr,Ca)AlSiN_3:Eu$, silicon nitride $Si_3N_4:Eu$, SiAlON:Eu, and the like.

An average particle size of optical conversion inorganic particles 41 (40) having a large particle size is usually 100 μm or less, preferably 30 μm or less. It is preferable that the average particle size of the optical conversion inorganic particles 41 stay within the above-described range since it is possible to reduce a spot diameter of output light output from the wavelength converter 1A because guidance of light trapped in the optical conversion inorganic particles 41 due to total reflection is limited to a range of the particle size. Moreover, it is preferable that the average particle size of the optical conversion inorganic particles 41 stay within the above-described range since it is possible to produce the optical conversion inorganic particles 41 in an inexpensive production process such as a coating method while reducing color variation of the output light of the wavelength converter 1A.

The average particle size of the optical conversion inorganic particles 41 (40) having a large particle size is obtained by observing the arbitrarily preprocessed optical conversion layer 30A by a scanning electron microscope (SEM) or the like and obtaining an average value of diameters of particles of which number is sufficiently significant from a statistical viewpoint, for example, 100.

Moreover, it is possible to determine a composition of the optical conversion inorganic particles 40 by a known analysis method such as energy dispersive X-ray spectrometry (EDX) and X-ray diffraction analysis (XRD).

The optical conversion inorganic particles 40 may be made of phosphors having the same composition, or may be a mixture of phosphor particles having two or more types of compositions.

It is preferable that a refractive index of the optical conversion inorganic particles 40 be larger than a refractive index of the binder portion 50A. When the refractive index of the optical conversion inorganic particles 40 is larger than the refractive index of the binder portion 50A, light is trapped in the inside of the phosphor due to total reflection. Therefore, in in-plane guided light in the binder portion 50A, components limited to the range of the particle size of the optical conversion inorganic particles 40 are increased. Hence, it is preferable that the refractive index of the optical conversion inorganic particles 40 be larger than the refractive index of the binder portion 50A since it is easy to reduce the spot diameter of the output light output from the wavelength converter 1A.

[Binder Portion]

Figure 2:
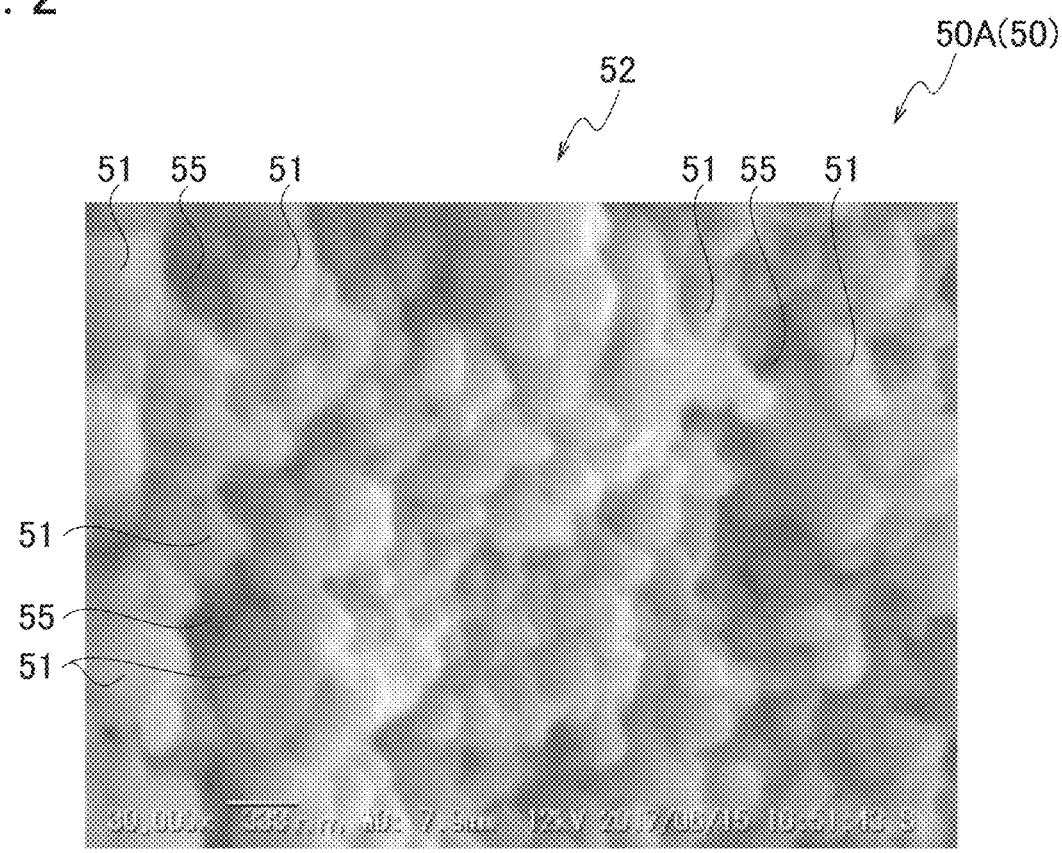
FIG. 2 is an example of a scanning electron microscope (SEM) picture showing a fracture surface of a binder portion (zinc oxide pellet) 50A of the wavelength converter 1A according to the first embodiment and Example 1.

The binder portion 50A will be described with reference to FIG. 2. FIG. 2 is an example of a scanning electron microscope (SEM) picture showing a fracture surface of the binder portion 50A of the wavelength converter 1A according to the first embodiment and Example 1 to be described later.

The binder portion 50A is a member that constitutes the optical conversion layer 30A and mutually holds the optical conversion inorganic particles 40. As shown in FIG. 2, the binder portion 50A contains, as a main component, the inorganic polycrystalline substance 52 composed in such a manner that the inorganic material particles 51 having an average particle size of 1 μm or less are bound to one another. Herein, "the binder portion 50A contains the inorganic polycrystalline substance 52 as a main component" means that a content ratio of the inorganic polycrystalline substance 52 in the binder portion 50A exceeds 50 mass %. The content ratio of the inorganic polycrystalline substance 52 in the binder portion 50A usually exceeds 50 mass %, and is preferably 90 to 100 mass %, more preferably 95 to 100 mass %.

The inorganic material particles 51 which constitute the inorganic polycrystalline substance 52 are granular bodies which are made of an inorganic material and have an outer shape with a plurality of facets. The inorganic material particles 51 are usually a polycrystalline substance, but may be crystal grains made of single crystals.

As an inorganic material that constitutes the inorganic material particles 51, for example, used are one or more types of metal oxides selected from the group consisting of zinc oxide (ZnO), magnesium oxide (MgO), aluminum nitride (AlN) and boron nitride (BN.) It is preferable that the inorganic material particles 51 be made of these metal oxides since the thermal conductivity of the binder portion 50A easily increases even if the average particle size of the inorganic material particles 51 is small and light scattering property thereof is high.

Moreover, it is preferable that such a metal oxide as a material of the inorganic material particles 51 be zinc oxide or magnesium oxide since the thermal conductivity of the binder portion 50A more easily increases even if the average particle size of the inorganic material particles 51 is small and the light scattering property thereof is high.

In the inorganic material particles 51 which constitute the inorganic polycrystalline substance 52, an average particle size thereof is 1 μm or less, preferably 100 nm to 1 μm, more preferably 100 nm to 500 nm. Herein, the average particle size means an average value of particles sizes obtained by SEM observation. It is preferable that the average particle size of the inorganic material particles 51 stay within the above-described range since the thermal conductivity and the light scattering can be increased.

As shown in FIG. 2, the inorganic polycrystalline substance 52 that constitutes the binder portion 50A has inter-inorganic-material-particle air gaps 55 as air gaps between the inorganic material particles 51 and 51 which constitute the inorganic polycrystalline substance 52. However, the inorganic polycrystalline substance 52 has a structure in which a small number of the inter-inorganic-material-particle air gaps 55, and the facets of the inorganic material particles 51 and 51 adjacent to each other adhere to each other.

Figure 10:
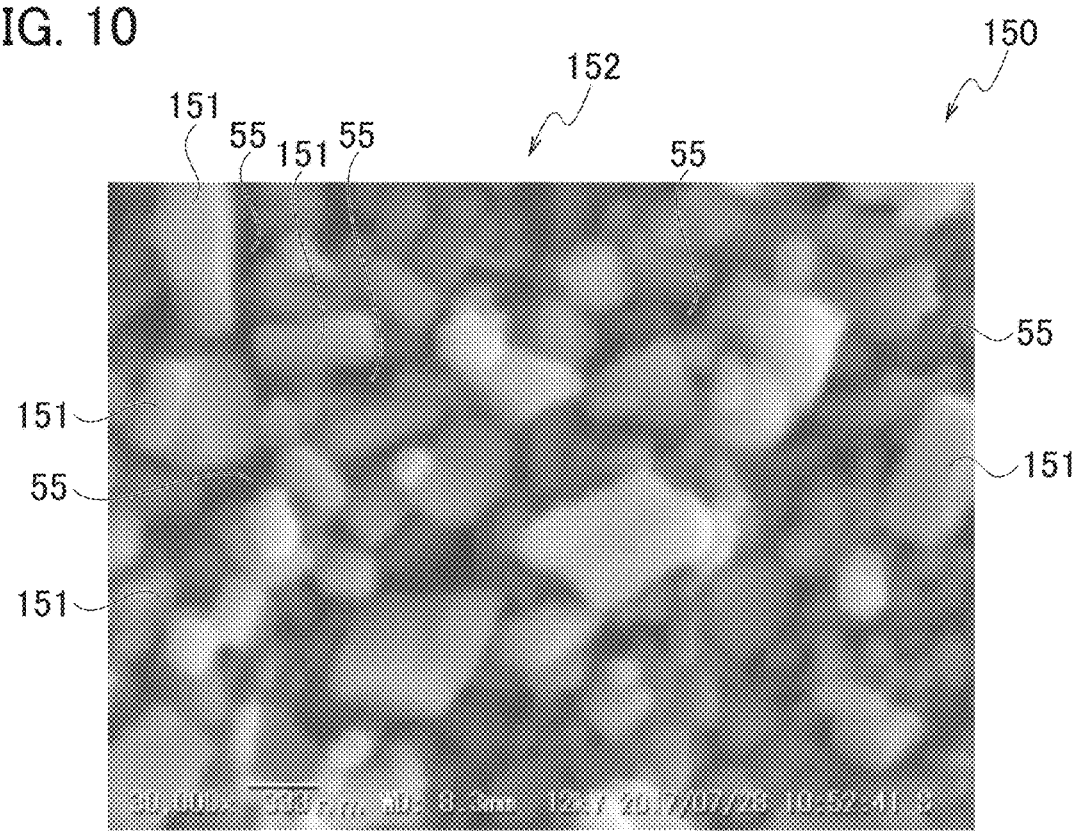
FIG. 10 is an example of a scanning electron microscope (SEM) picture showing a fracture surface of the binder portion (zinc oxide pellet) 150 of the wavelength converter 100 of Comparative example 1.

Herein, the binder portion 50A shown in FIG. 2 and a binder portion of a conventional wavelength converter are described with reference to the drawings. FIG. 10 is an example of a scanning electron microscope (SEM) picture showing a fracture surface of the binder portion 150 of the wavelength converter 100 of Comparative example 1, which is the conventional wavelength converter.

As shown in FIG. 10, the binder portion 150 of the conventional wavelength converter contains, as a main component, an inorganic polycrystalline substance 152 composed in such a manner that inorganic material particles 151 are bound to one another. As shown in FIG. 10, the inorganic material particles 151 and the inorganic polycrystalline substance 152 in the conventional binder portion 150 are those corresponding to the inorganic material particles 51 and the inorganic polycrystalline substance 52 in the binder portion 50A shown in FIG. 2, respectively.

As shown in FIG. 10, in the conventional inorganic polycrystalline substance 152, ridge lines and lines which constitute corner portions are clear in a large number of the inorganic material particles 151. Moreover, a size of the inorganic material particles 151 of the conventional inorganic material particles 151 of the conventional inorganic polycrystalline substance 152 is larger than that of the inorganic material particles 51 of the inorganic polycrystalline substance 52 in this embodiment. Furthermore, in the conventional inorganic polycrystalline substance 152, the inorganic material particles 151 and 151 thinly bond to each other, the number of inter-inorganic-material-particle air gaps 55 which are air gaps between the inorganic material particles 151 and 151 which constitute the inorganic polycrystalline substance 152 is extremely large, and a depth of the inter-inorganic-material-particle air gaps 55 is also large.

In contrast, as shown in FIG. 2, in the inorganic polycrystalline substance 52 of this embodiment, ridge lines and corner portions thereof are rounded in a large number of the inorganic material particles 151, and the ridge lines and lines which constitute the corner portions are not clear. Moreover, a size of the inorganic material particles 51 of the inorganic polycrystalline substance 52 in this embodiment is smaller than that of the inorganic material particles 151 of the conventional inorganic polycrystalline substance 152, and the average particle size of the inorganic material particles 51 is 1 μm or less as described above. Furthermore, in the inorganic polycrystalline substance 52 of this embodiment, which is shown in FIG. 2, the inorganic material particles 51 and 51 densely bond to each other, the number of inter-inorganic-material-particle air gaps 55 which are air gaps between the inorganic material particles 51 and 51 which constitute the inorganic polycrystalline substance 52 is small, and a depth of the inter-inorganic-material-particle air gaps 55 is also small.

As described above, the inorganic polycrystalline substance 52 that constitutes the binder portion 50A shown in FIG. 2 and the inorganic polycrystalline substance 152 that constitutes the binder portion 150 of the conventional wavelength converter shown in FIG. 10 are obviously different from each other in terms of a microscopic structure.

In the case where the inorganic polycrystalline substance 52 is made of zinc oxide, a relative density of the inorganic polycrystalline substance 52 is usually 50% to 100%, preferably 70% to 100%.

Moreover, a relative density of the inorganic polycrystalline substance 52, which is obtained by dividing the density of the inorganic polycrystalline substance 52 by a density of a bulk of the inorganic polycrystalline substance 52, is usually 50% to 100%, preferably 70% to 100%. It is understood that, in the inorganic polycrystalline substance 52, the number of inter-inorganic-material-particle air gaps 55 is small also from the fact that the relative density thereof is high as described above.

The inorganic polycrystalline substance 52 having the microscopic structure, which is shown in FIG. 2, is a dilute-acid pressed inorganic sintered body obtained by pressurizing raw material powder of the inorganic material particles 51 under the presence of dilute acid and sintering the pressurized raw material powder at a low temperature. Herein, such low-temperature sintering means sintering at 60 to 200° C., preferably 70 to 150° C., more preferably 80 to 120° C. Moreover, the dilute acid means low-concentration acid diluted with water. As the acid, for example, used are organic acid such as carboxylic acid and inorganic acid such as phosphoric acid and boric acid. Meanwhile, the conventional inorganic polycrystalline substance 152 having the microscopic structure, which is shown in FIG. 10, is a water-pressed inorganic sintered body obtained by sintering the raw material powder of the inorganic material particles 151 at a low temperature under the presence of water.

Figure 9:
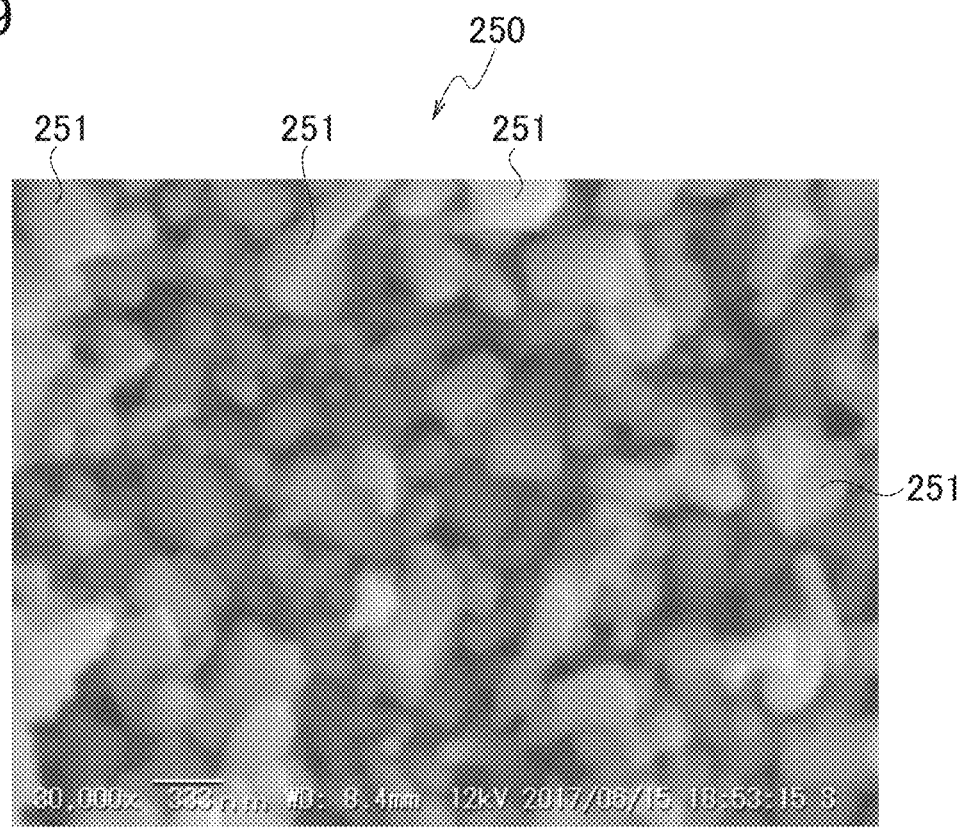
FIG. 9 is an example of a scanning electron microscope (SEM) picture showing zinc oxide powder 250 that is raw material powder of an inorganic polycrystalline substance 52 that constitutes the binder portion 50A of Example 1 and an inorganic polycrystalline substance 152 that constitutes a binder portion 150 of Comparative example 1.

FIG. 9 is an example of a scanning electron microscope (SEM) picture showing zinc oxide (ZnO) powder that is raw material powder of the inorganic polycrystalline substance 52 that constitutes the binder portion 50A of Example 1 to be described later and the inorganic polycrystalline substance 152 that constitutes the binder portion 150 of Comparative example 1 to be described later. Note that zinc oxide powder 250 shown in FIG. 9 corresponds to each raw material powder of the inorganic material particles 51 that constitutes the inorganic polycrystalline substance 52 of the binder portion 50A shown in FIG. 2 and the inorganic material particles 151 that constitutes the inorganic polycrystalline substance 152 of the binder portion 150 shown in FIG. 10.

As shown in FIG. 9, the zinc oxide powder 250 is formed into inorganic material particles 251 in which a particle size ranges from 100 nm to 500 nm and ridge lines and lines which constitute corner portions are clear. Note that powder of the above-described metal oxides other than zinc oxide (ZnO) is also formed into inorganic material particles having a shape in which ridge lines are clear like the zinc oxide powder 250.

It is understood that both of the inorganic material particles 251 of the zinc oxide powder 250 shown in FIG. 9 and the inorganic material particles 151 which constitute the conventional inorganic polycrystalline substance 152 shown in FIG. 10 have a shape in which the ridge lines and the lines which constitute the corner portions are clear. Meanwhile, it is understood that, in the inorganic material particles 51 which constitute the inorganic polycrystalline substance 52 of this embodiment, which is shown in FIG. 2, the ridge lines and the corner portions are rounded, and the ridge lines and the lines which constitute the corner portions are not clear. As described above, in terms of shape of the particles, the inorganic material particles 51 which constitute the inorganic polycrystalline substance 52 of this embodiment, which is shown in FIG. 2, are different from the inorganic material particles 251 of the zinc oxide powder 250 shown in FIG. 9 and the inorganic material particles 151 which constitute the conventional inorganic polycrystalline substance 152 shown in FIG. 10.

A reason why the ridge lines and corner portions of the inorganic material particles 51 of the inorganic polycrystalline substance 52 of this embodiment, which is shown in FIG. 2, are rounded is presumed to be that the inorganic polycrystalline substance 52 is the dilute-acid pressed inorganic sintered body. That is, it is presumed that the ridge lines and corner portions of the inorganic material particles 51 are rounded by dilute acid and pressurization since the inorganic polycrystalline substance 52 that is the dilute-acid pressed inorganic sintered body is obtained by pressuring such raw material powder as the zinc oxide powder 250 shown in FIG. 9 under the presence of the dilute acid and sintering the pressurized raw material powder at a low temperature.

Specifically, it is presumed that, in the inorganic material particles 51 composed of the metal oxide, the facets and the surfaces of the ridge lines, the corner portion and the like are locally dissolved by the dilute acid. Then, it is presumed that, at this time, a dissolution rate of the ridge lines and the corner portions is higher than that of the facets, and accordingly, the ridge lines and corner portions of the inorganic material particles 51 are rounded. Moreover, it is presumed that, on the surfaces of the facets, a large number of the inorganic material particles 51 dissolved or softened immediately before being dissolved are pressurized together therewith, whereby the number of gaps between the inorganic material particles 51 and 51 is small, and such an inorganic polycrystalline substance 52 in which the facets between the inorganic material particles 51 and 51 adhere to each other is obtained.

Therefore, it is presumed that, in the inorganic polycrystalline substance 52 of this embodiment, which is composed of the dilute-acid pressed inorganic sintered body, the number of gaps each between the adjacent inorganic material particles 51 and 51 per unit volume is reduced as shown in FIG. 2. Moreover, it is presumed that, in the inorganic polycrystalline substance 52 of this embodiment, which is composed of the dilute-acid pressed inorganic sintered body, a structure is formed as shown in FIG. 2, in which an area per unit volume in the facets in each of which the adjacent inorganic material particles 51 and 51 adhere to each other is large. In the inorganic polycrystalline substance 52 of this embodiment, which is composed of the dilute-acid pressed inorganic sintered body as described above, such a structure is formed, in which the area per unit volume in the facets in each of which the adjacent inorganic material particles 51 and 51 adhere to each other is large. Accordingly, there increases the thermal conductivity of the inorganic polycrystalline substance 52.

The binder portion 50A contains, as a main component, the inorganic polycrystalline substance 52 composed of the dilute-acid pressed inorganic sintered body, and accordingly, the thermal conductivity thereof is 2 W/mk or more.

The refractive index of the binder portion 50A differs depending on the material of the binder portion 50A. In the case where the inorganic material that constitutes the inorganic material particles 51 of the binder portion 50A is zinc oxide, magnesium oxide, aluminum nitride and boron nitride, the refractive index of the binder portion 50A is approximately 2.0, 1.74, 2.2 and 2.17, respectively.

In the case where the inorganic polycrystalline substance 52 is the dilute-acid pressed inorganic sintered body, it is preferable that the inorganic polycrystalline substance 52 be as follows. That is, it is preferable that, in the substrate portion 10A and the binder portion 50A in the optical conversion layer 30A, the substrate portion 10A and the dilute-acid pressed inorganic sintered body in the binder portion 50A directly bond to each other on at least a part of an interface between the substrate portion 10A and the binder portion 50A. It is preferable that the substrate portion 10A and the dilute-acid pressed inorganic sintered body in the binder portion 50A directly bond to each other since there increases such heat conduction between the substrate portion 10A and the binder portion 50A.

Figure 3:
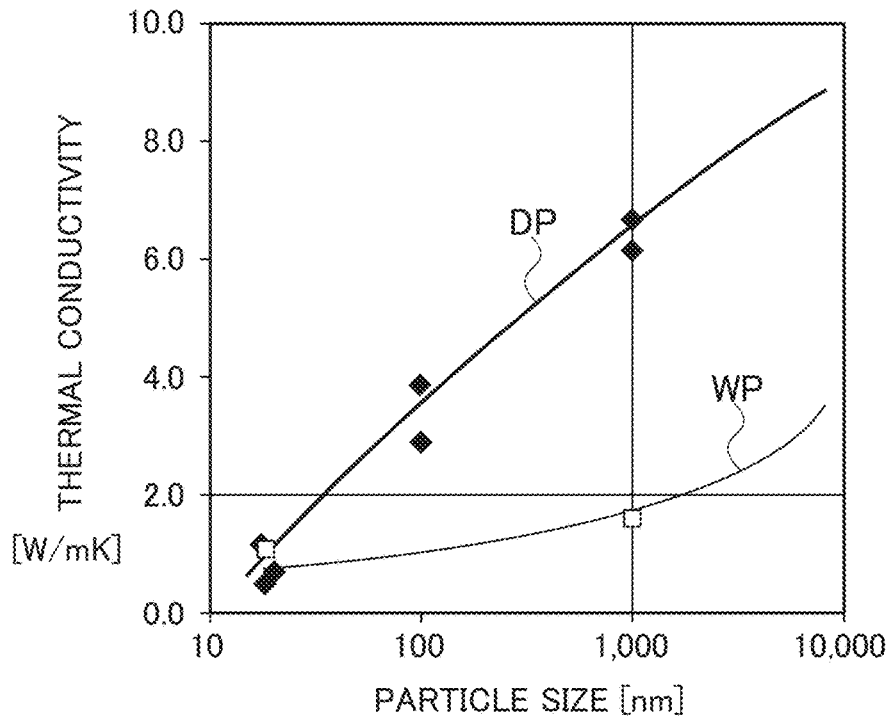
FIG. 3 is a graph illustrating a relationship between a particle size (average particle size) and thermal conductivity of inorganic material particles in an inorganic polycrystalline substance that constitutes a binder portion.

Herein, a description will be given of a relationship between the average particle size and thermal conductivity of the inorganic material particles in the inorganic polycrystalline substance for each of the case where the inorganic polycrystalline substance is the dilute-acid pressed inorganic sintered body and the case where the inorganic polycrystalline substance is the water-pressed inorganic sintered body. FIG. 3 is a graph illustrating a relationship between the particle size (average particle size) and thermal conductivity of the inorganic material particles in the inorganic polycrystalline substance that constitutes the binder portion. In FIG. 3, a graph in the case where the inorganic polycrystalline substance is the dilute-acid pressed inorganic sintered body is represented by DP, and a graph in the case where the inorganic polycrystalline substance is the water-pressed inorganic sintered body is represented by WP.

As illustrated in DP of FIG. 3, in the case where the inorganic polycrystalline substance 52 that constitutes the binder portion 50A is the dilute-acid pressed inorganic sintered body shown in FIG. 2, the particle size (average particle size) of the inorganic material particles 51 and the thermal conductivity thereof are substantially proportional to each other, and the inorganic polycrystalline substance 52 exhibits a small particle size and high thermal conductivity. Meanwhile, in the case where the inorganic polycrystalline substance 152 that constitutes the binder portion is the water-pressed inorganic sintered body shown in FIG. 10, the particle size (average particle size) and thermal conductivity of the inorganic material particles 151 are not in a proportional relationship, in which thermal conductivity is reduced in spite of a large particle size.

Therefore, in the case where the inorganic polycrystalline substance 52 that constitutes the binder portion 50A is the dilute-acid pressed inorganic sintered body, such a binder portion 50A is obtained, in which the thermal conductivity is high, light scatters largely, and the thermal conductivity and the light scattering properties are easy to adjust to predetermined values. Such easiness to adjust the thermal conductivity and the light scattering properties to predetermined values is an effect based on the fact that the particle size (average particle size) and thermal conductivity of the inorganic material particles 51 are substantially proportional to each other.

<Manufacturing Method>

The wavelength converter 1A is obtained by forming the optical conversion layer 30A on the surface of the substrate portion 10A. The optical conversion layer 30A is obtained, for example, by mounting the substrate portion 10A into a metal mold, supplying the substrate portion 10A with a mixture of the optical conversion inorganic particles 40, the raw material powder of the binder portion 50A and the dilute acid, and sintering the mixture at a low temperature while pressurizing the mixture. By such low-temperature sintering, the binder portion 50A is obtained, which contains the inorganic polycrystalline substance 52 composed of the dilute-acid pressed inorganic sintered body.

The dilute acid means low-concentration acid diluted with water. As the acid, for example, used are organic acid such as carboxylic acid and inorganic acid such as phosphoric acid and boric acid. A degree of diluting the acid with water is appropriately set in response to a composition, average particle size and the like of the raw material powder of the binder portion 50A. The mixture is pressurized at 1 MPa to 1000 MPa for example, preferably 10 MPa to 500 MPa, more preferably 350 MPa to 450 MPa. Moreover, the low-temperature sintering is performed at a temperature of usually 60 to 200° C., preferably 70 to 150° C., more preferably 80 to 120° C. When a resultant thus formed is demolded from the metal mold after being cooled, the wavelength converter 1A is obtained.

<Functions of First Embodiment>

When the excitation light enters the wavelength converter 1A illustrated in FIG. 1 from the surface of the optical conversion layer 30A, the optical conversion inorganic particles 40 perform wavelength conversion for the excitation light, and emit florescence. Note that, in the case where the excitation light is excitation light with a high power density, which is applied from a semiconductor laser or the like, a large amount of heat is generated in the optical conversion layer 30A. However, the inorganic polycrystalline substance 52 that is a main component of the binder portion 50A is composed of the dilute-acid pressed inorganic sintered body and has high thermal conductivity, and accordingly, heat dissipation from the binder portion 50A is efficiently carried out in the wavelength converter 1A. Therefore, in accordance with the wavelength converter 1A, the temperature quenching is less liable to occur in the optical conversion inorganic particles 40. Moreover, in the inorganic polycrystalline substance 52 in the optical conversion layer 30A, the particle size (average particle size) of the inorganic material particles 51 is small, and the fluorescence and the excitation light scatter largely in the optical conversion layer 30A, and accordingly, high-energy fluorescence and excitation light are suppressed from being applied to an irradiation object and a viewer.

<Effects of First Embodiment>

In accordance with the wavelength converter 1A according to the first embodiment, the wavelength converter is obtained, in which thermal conductivity is high and light scatters largely. Moreover, in accordance with the wavelength converter 1A, a wavelength converter is obtained, in which it is easy to adjust thermal conductivity and light scattering properties to predetermined values. Furthermore, in the case where the binder portion 50A of the wavelength converter 1A includes the metal oxide, then in accordance with the wavelength converter 1A, a wavelength converter in which light extraction efficiency is high is obtained.

(Modified Example of First Embodiment)

In the wavelength converter 1A according to the first embodiment, a mode is described, in which other substances are not disposed in the inter-inorganic-material-particle air gaps 55 formed in the inorganic polycrystalline substance 52 that is a main component of the binder portion 50A. In contrast, as a first modified example, there can be used a wavelength converter in a mode in which an in-air-gap inorganic material portion is included in the inter-inorganic-material-particle air gaps 55 formed in the inorganic polycrystalline substance 52 that is a main component of the binder portion 50A.

Specifically, as the first modified example, such a wavelength converter can be formed, in which the binder portion 50A further includes in-air-gap inorganic material portion composed of inorganic crystal having a particle equivalent radius of 10 nm or less in the inter-inorganic-material-particle air gaps 55. Herein, the inter-inorganic-material-particle air gaps 55 mean air gaps in which the inorganic polycrystalline substance 52 is formed between the inorganic material particles 51 and 51 which constitute the inorganic polycrystalline substance 52. Moreover, the particle equivalent radius means a radius in the case where the in-air-gap inorganic material portion is converted into a sphere with the same volume.

In the first modified example, the in-air-gap inorganic material portion is composed of the inorganic crystal, in which the particle equivalent radius is 10 nm or less. As the inorganic crystal, for example, zinc oxide, magnesium oxide and the like are used. It is preferable that the in-air-gap inorganic material portion be composed of the inorganic crystal since thermal conductivity thereof is high.

The in-air-gap inorganic material portion is included in the inter-inorganic-material-particle air gaps 55. Specifically, the in-air-gap inorganic material portion bonds to one or more surfaces owned by one or more of the inorganic material particles 51 surrounding the inter-inorganic-material-particle air gaps 55, thereby being included in the inter-inorganic-material-particle air gaps 55. The in-air-gap inorganic material portion may be filled without any gap between the surfaces owned by the inorganic material particles 51 surrounding the inter-inorganic-material-particle air gaps 55, or may be fixed thereto with gaps.

<Manufacturing Method>

The wavelength converter according to the first modified example is obtained by forming an optical conversion layer 30 according to the first modified example on the surface of the substrate portion 10A. The optical conversion layer 30 according to the first modified example is obtained, for example, by mounting the substrate portion 10A into a metal mold, supplying the substrate portion 10A with a mixture of the optical conversion inorganic particles 40, the raw material powder of the binder portion 50, the dilute acid and raw material powder of the in-air-gap inorganic material portion, and sintering the mixture at a low temperature while pressurizing the mixture. By such low-temperature sintering, the binder portion 50 is obtained, which contains the inorganic polycrystalline substance 52 composed of the dilute-acid pressed inorganic sintered body.

<Functions of First Modified Example>

Functions of the wavelength converter according to the first modified example are the same as the functions of the wavelength converter 1A according to the first embodiment except for a function brought by the fact that the in-air-gap inorganic material portion is included in the inter-inorganic-material-particle air gaps 55 of the binder portion 50A. Therefore, a description will be given of only the function brought by the fact that in-air-gap inorganic material portion is included in the inter-inorganic-material-particle air gaps 55 of the binder portion 50A.

In the wavelength converter 1A according to the first embodiment, when heat is generated in the optical conversion layer 30A by the application of the excitation light, or the like, the heat is dissipated efficiently from the binder portion 50A containing the inorganic polycrystalline substance 52 having high thermal conductivity. However, in the wavelength converter 1A of the first embodiment, the atmosphere is present in the inter-inorganic-material-particle air gaps 55 of the binder portion 50A, and accordingly, heat conduction in the inter-inorganic-material-particle air gaps 55 is small.

In contrast, in the wavelength converter according to the first modified example, the in-air-gap inorganic material portion is included in the inter-inorganic-material-particle air gaps 55 of the binder portion 50, and accordingly, the heat conduction in the inter-inorganic-material-particle air gaps 55 becomes larger than in the wavelength converter 1A according to the first embodiment. Therefore, in comparison with the wavelength converter 1A according to the first embodiment, the wavelength converter according to the first modified example achieves higher thermal conductivity of the binder portion 50.

<Effects of First Modified Example>

The wavelength converter according to the first modified example exerts at least a similar effect to that of the wavelength converter 1A according to the first embodiment. Moreover, in comparison with the wavelength converter 1A according to the first embodiment, the wavelength converter according to the first modified example achieves higher thermal conductivity of the binder portion 50.

Second Embodiment

Figure 4:
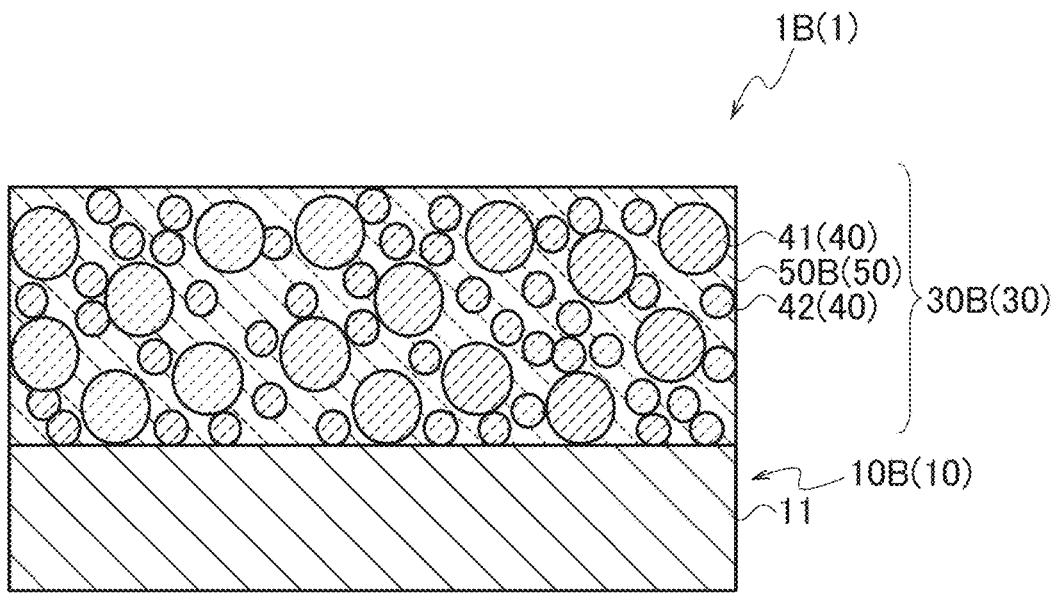
FIG. 4 is a schematic cross-sectional view of a wavelength converter according to a second embodiment.

FIG. 4 is a schematic cross-sectional view of a wavelength converter according to a second embodiment. As illustrated in FIG. 4, a wavelength converter 1B according to the second embodiment includes a substrate portion 10B (10), and an optical conversion layer 30B (30) formed on the substrate portion 10B.

In comparison with the wavelength converter 1A according to the first embodiment, the wavelength converter 1B according to the second embodiment is one provided with a substrate portion 10B and an optical conversion layer 30B in place of the substrate portion 10A and the optical conversion layer 30A, respectively. The same reference numerals are assigned to the same constituents between the wavelength converter 1B according to the second embodiment and the wavelength converter 1A according to the first embodiment, and a description of configurations and functions thereof will be omitted or simplified.

<Substrate Portion>

As the substrate portion 10B, a similar one to the substrate portion 10A is used. Therefore, a description of the substrate portion 10B will be omitted.

<Optical Conversion Layer>

The optical conversion layer 30B includes optical conversion inorganic particles 40 (41, 42) and a binder portion 50B (50) that mutually holds the optical conversion inorganic particles 40, and is formed on the substrate portion 10B. The optical conversion inorganic particles 40 of the optical conversion layer 30B include optical conversion inorganic particles 41 having a large particle size and optical conversion inorganic particles 42 having a smaller particle size than the optical conversion inorganic particles 41.

[Optical Conversion Inorganic Particle]

The optical conversion inorganic particles 41 having a large particle size, which are included in the optical conversion inorganic particles 40 of the optical conversion layer 30B, are the same as the optical conversion inorganic particles 41 having a large particle size, which are included in the optical conversion layer 30A of the wavelength converter 1A according to the first embodiment, and accordingly, a description thereof will be omitted.

The optical conversion inorganic particles 42 having a small particle size, which are included in the optical conversion inorganic particles 40 of the optical conversion layer 30B, are optical conversion inorganic particles having a smaller particle size than the optical conversion inorganic particles 41 having a large particle size. An average particle size of the optical conversion inorganic particles 42 having a small particle size is usually 100 μm or less, preferably 20 μm or less. The particle size of the optical conversion inorganic particles 42 having a small particle size are measurable similarly to the particle size of the optical conversion inorganic particles 41 having a large particle size.

It is preferable that the average particle size of the optical conversion inorganic particles 42 stay within the above-described range since the content of the optical conversion inorganic particles 40 in the optical conversion layer 30B can be increased in such a manner that the optical conversion inorganic particles 42 having a small particle size are filled into gaps between the optical conversion inorganic particles 41 having a large particle size. It is preferable that the content of the optical conversion inorganic particles 40 in the optical conversion layer 30B be increased since an output of fluorescence from the optical conversion layer 30B is increased.

Like the optical conversion material that constitutes the optical conversion inorganic particles 41 having a large particle size, a type of an optical conversion material that constitutes the optical conversion inorganic particles 42 having a small particle size is not particularly limited as long as the optical conversion material is capable of photoluminescence. Moreover, the optical conversion material that constitutes the optical conversion inorganic particles 42 having a small particle size and the optical conversion material that constitutes the optical conversion inorganic particles 41 having a large particle size may be the same or different from each other.

[Binder Portion]

The binder portion 50B is similar to the binder portion 50A of the wavelength converter 1A according to the first embodiment, and accordingly, a description thereof will be omitted.

<Manufacturing Method>

For example, the wavelength converter 1B is obtained by using, as the optical conversion inorganic particles 40, the optical conversion inorganic particles 41 having a large particle size and the optical conversion inorganic particles 42 having a small particle size in the manufacturing method of the wavelength converter 1A according to the first embodiment.

<Functions of Second Embodiment>

Functions of the wavelength converter 1B according to the second embodiment are the same as the functions of the wavelength converter 1A according to the first embodiment except that, as the optical conversion inorganic particles 40, the optical conversion inorganic particles 41 having a large particle size and the optical conversion inorganic particles 42 having a small particle size are included. In the wavelength converter 1B according to the second embodiment, the optical conversion inorganic particles 42 having a small particle size are filled into the gaps between the optical conversion inorganic particles 41 having a large particle size, whereby the content of the optical conversion inorganic particles 40 in the optical conversion layer 30B can be increased, and the output of the fluorescence can be increased.

<Effects of Second Embodiment>

The wavelength converter 1B according to the second embodiment exerts at least a similar effect to that of the wavelength converter 1A according to the first embodiment. Moreover, the wavelength converter 1B according to the second embodiment can increase the output of the fluorescence in comparison with the wavelength converter 1A according to the first embodiment.

Third Example Embodiment

Figure 5:
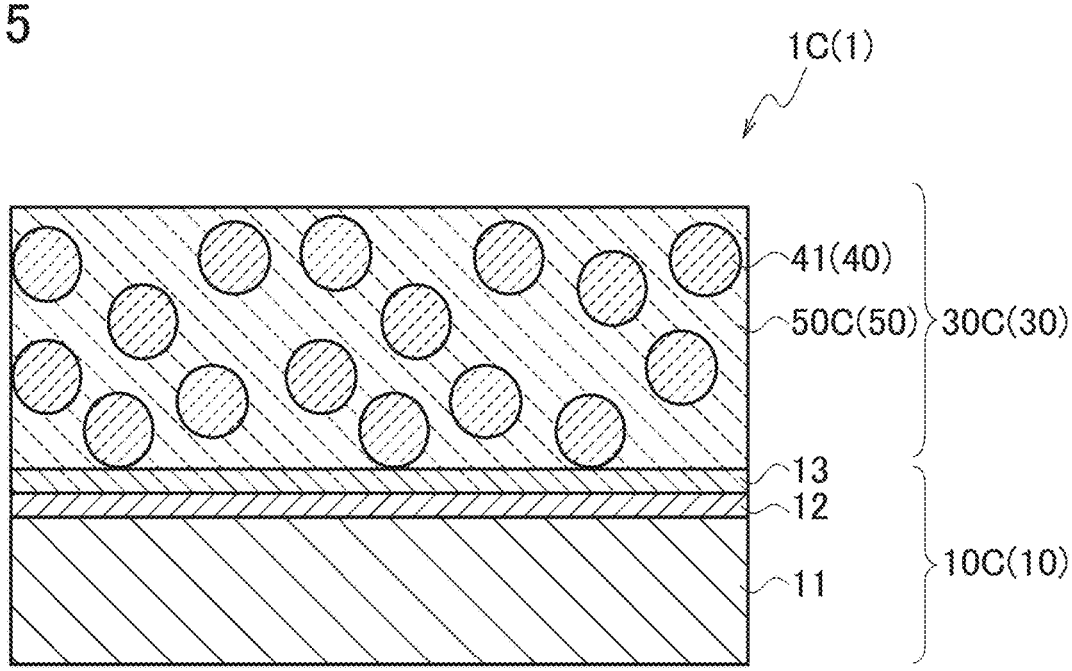
FIG. 5 is a schematic cross-sectional view of a wavelength converter according to a third embodiment.

FIG. 5 is a schematic cross-sectional view of a wavelength converter according to a third embodiment. As illustrated in FIG. 5, a wavelength converter 1C according to the third embodiment includes a substrate portion 10C (10), and an optical conversion layer 30C (30) formed on the substrate portion 10C.

In comparison with the wavelength converter 1A according to the first embodiment, the wavelength converter 1C according to the third embodiment is one provided with a substrate portion 10C and an optical conversion layer 30C in place of the substrate portion 10A and the optical conversion layer 30A, respectively. The same reference numerals are assigned to the same constituents between the wavelength converter 1C according to the third embodiment and the wavelength converter 1A according to the first embodiment, and a description of configurations and functions thereof will be omitted or simplified.

<Substrate Portion>

The substrate portion 10C includes a substrate body 11, a light reflecting film 12 laminated on a surface of the substrate body 11, and a protective film 13 laminated on a surface of the light reflecting film 12. The substrate body 11 is the same as the substrate body 11 of the wavelength converter 1A according to the first embodiment, and accordingly, a description thereof will be omitted.

The light reflecting film 12 is provided so that reflectance of a surface of the substrate portion 10C, which is closer to the optical conversion layer 30C, becomes high. Specifically, the light reflecting film 12 is provided so that the reflectance of the surface of the substrate portion 10C, which is closer to the optical conversion layer 30C, becomes 90% or more for example. The substrate portion 10C includes the light reflecting film 12 on the surface thereof closer to the optical conversion layer 30C, and accordingly, excitation light that is not subjected to the optical conversion in the optical conversion layer 30C and fluorescence generated in the optical conversion layer 30C are radiated efficiently from an air interface of the optical conversion layer 30C. As a material of the light reflecting film 12, for example, there are used silver, aluminum and the like, and a dielectric multilayer film. In the light reflecting film 12, the dielectric multilayer film means a laminated body of optical thin films, which uses plural types of dielectric materials having different refractive indices. Usually, the dielectric multilayer film has partial translucency. A thickness of the light reflecting film 12 is, for example, 0.1 to 1000 μm, preferably 0.1 to 1 μm.

The protective film 13 is a film that protects the light reflecting film 12 physically and chemically. For example, in the case where the light reflecting film 12 is silver, the surface thereof is oxidized when the light reflecting film 12 is exposed to air; however, the light reflecting film 12 is protected from being oxidized and physically damaged by providing the protective film 13 on the surface of the light reflecting film 12. As a material of the protective film 13 for example, there is used an inorganic material composed of a nitride such as $Si_3N_4$ and an oxide such as $SiO_2$. Note that, in the case where it is not necessary to protect the light reflecting film 12, then as a modified example of the third embodiment, a wavelength converter in a form in which the protective film 13 is not provided on the light reflecting film 12 may be formed.

<Optical Conversion Layer>

As the optical conversion layer 30C, a similar one to the optical conversion layer 30A is used. Therefore, a description of the optical conversion layer 30C will be omitted.

<Manufacturing Method>

The wavelength converter 1C is obtained, for example, by using the substrate portion 10C in place of the substrate portion 10A in the manufacturing method of the wavelength converter 1A according to the first embodiment. The substrate portion 10C can be manufactured by a well-known method.

<Functions of Third Embodiment>

Functions of the wavelength converter 1C according to the third embodiment are the same as the functions of the wavelength converter 1A according to the first embodiment except that the reflectance of the surface of the substrate portion 10C, which is closer to the optical conversion layer 30C, becomes high by providing the light reflecting film 12 and the protective film 13.

<Effects of Third Embodiment>

The wavelength converter 1C according to the third embodiment exerts at least a similar effect to that of the wavelength converter 1A according to the first embodiment. Moreover, the wavelength converter 1C according to the third embodiment can increase the output of the fluorescence in comparison with the wavelength converter 1A according to the first embodiment.

Fourth Embodiment

Figure 6:
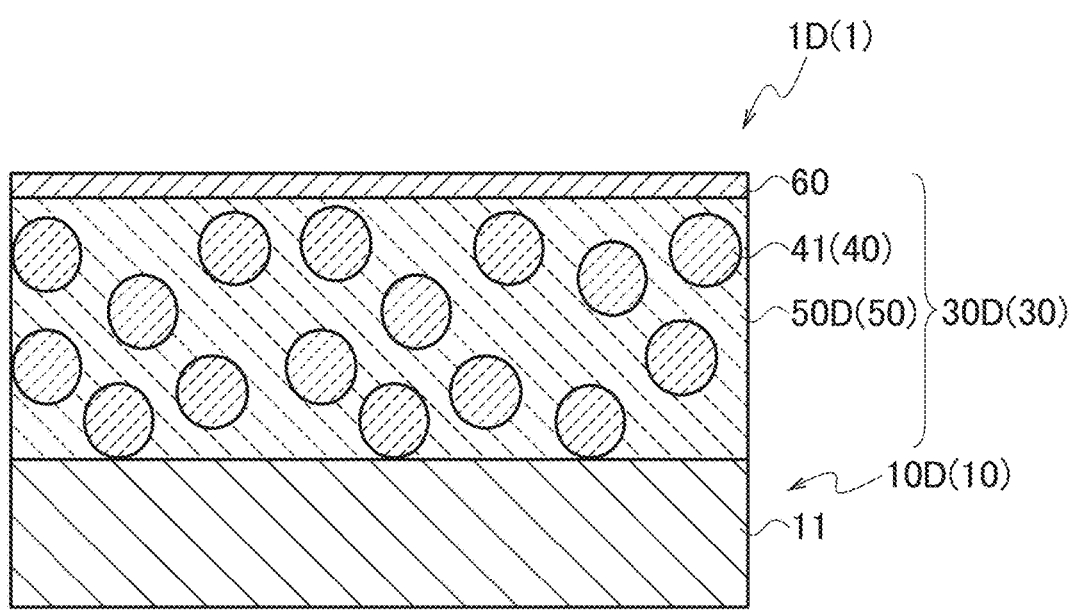
FIG. 6 is a schematic cross-sectional view of a wavelength converter according to a fourth embodiment.

FIG. 6 is a schematic cross-sectional view of a wavelength converter according to a fourth embodiment. As illustrated in FIG. 6, a wavelength converter 1D according to the fourth embodiment includes a substrate portion 10D (10), an optical conversion layer 30D (30) formed on the substrate portion 10D, and a moisture barrier layer 60 formed on the optical conversion layer 30D. The wavelength converter 1D includes the moisture barrier layer 60 that covers a surface of the optical conversion layer 30D, which is remote from the substrate portion 10D.

In comparison with the wavelength converter 1A according to the first embodiment, the wavelength converter 1D according to the fourth embodiment is one provided with the substrate portion 10D and the optical conversion layer 30D in place of the substrate portion 10A and the optical conversion layer 30A, respectively, and further provided with the moisture barrier layer 60. The same reference numerals are assigned to the same constituents between the wavelength converter 1D according to the third embodiment and the wavelength converter 1A according to the first embodiment, and a description of configurations and functions thereof will be omitted or simplified.

<Substrate Portion>

As the substrate portion 10D, a similar one to the substrate portion 10A is used. Therefore, a description of the substrate portion 10D will be omitted.

<Optical Conversion Layer>

As the optical conversion layer 30D, a similar one to the optical conversion layer 30A is used. Therefore, a description of the optical conversion layer 30D will be omitted.

<Moisture Barrier Layer>

The moisture barrier layer 60 is a layer that covers at least a part of the surface of the optical conversion layer 30D, thereby preventing or suppressing entrance of moisture into the optical conversion layer 30D. As a material of the moisture barrier layer 60, for example, there is used a laminated structure of an inorganic material layer of $Si_3N_4$, $SiO_2$ or the like and an organic-based coating layer.

<Manufacturing Method>

For example, the wavelength converter 1D can be manufactured in such a manner that, after the wavelength converter 1A according to the first embodiment is obtained, the moisture barrier layer 60 is formed on the surface of the optical conversion layer 30A (30D) of the wavelength converter 1A by a well-known method.

<Functions of Fourth Embodiment>

Functions of the wavelength converter 1D according to the fourth embodiment are the same as the functions of the wavelength converter 1A according to the first embodiment except that water resistance of the surface of the optical conversion layer 30D is improved by providing the moisture barrier layer 60 on the surface of the optical conversion layer 30D.

<Effects of Fourth Embodiment>

The wavelength converter 1D according to the fourth embodiment exerts at least a similar effect to that of the wavelength converter 1A according to the first embodiment. Moreover, the wavelength converter 1D according to the fourth embodiment can improve the water resistance of the surface of the optical conversion layer 30D in comparison with the wavelength converter 1A according to the first embodiment.

Fifth Embodiment

Figure 7:
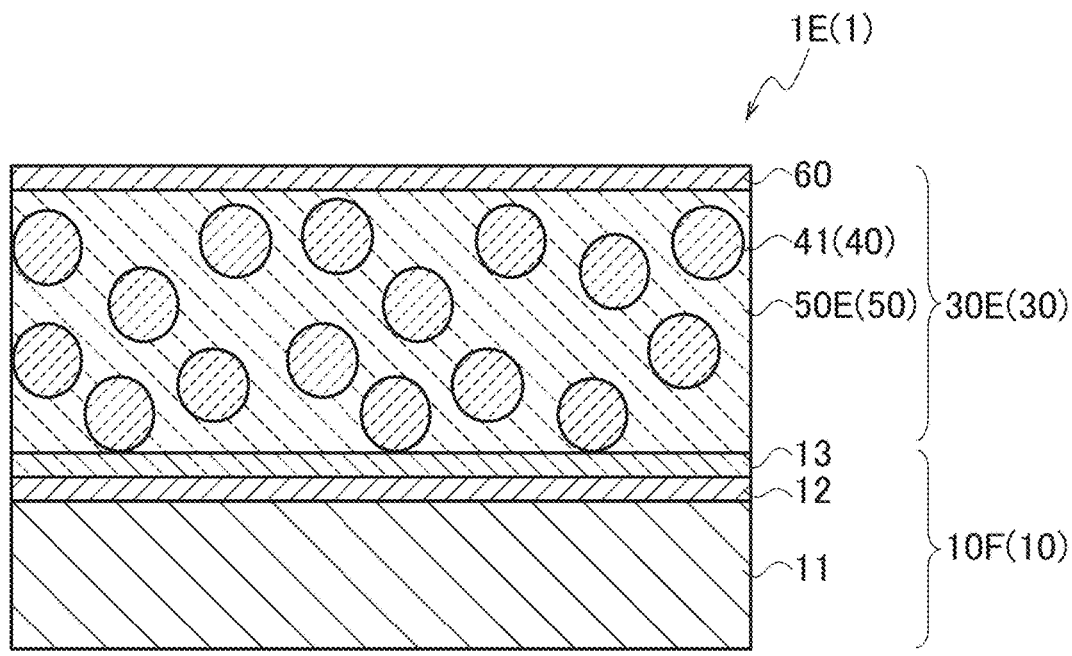
FIG. 7 is a schematic cross-sectional view of a wavelength converter according to a fifth embodiment.

FIG. 7 is a schematic cross-sectional view of a wavelength converter according to a fifth embodiment. As illustrated in FIG. 7, a wavelength converter 1E according to the fifth embodiment includes a substrate portion 10E (10), an optical conversion layer 30E (30) formed on the substrate portion 10E, and a moisture barrier layer 60 formed on the optical conversion layer 30E.

In comparison with the wavelength converter 1A according to the first embodiment, the wavelength converter 1E according to the fifth embodiment is one provided with the substrate portion 10E and the optical conversion layer 30E in place of the substrate portion 10A and the optical conversion layer 30A, respectively, and further provided with the moisture barrier layer 60. The same reference numerals are assigned to the same constituents between the wavelength converter 1E according to the fifth embodiment and the wavelength converter 1A according to the first embodiment, and a description of configurations and functions thereof will be omitted or simplified.

<Substrate Portion>

The substrate portion 10E includes a substrate body 11, a light reflecting film 12 laminated on a surface of the substrate body 11, and a protective film 13 laminated on a surface of the light reflecting film 12. The substrate portion 10E is the same as the substrate portion 10C of the wavelength converter 1C according to the third embodiment, and accordingly, a description thereof will be omitted.

<Optical Conversion Layer>

As the optical conversion layer 30E, a similar one to the optical conversion layer 30A of the wavelength converter 1A according to the first embodiment is used. Therefore, a description of the optical conversion layer 30E will be omitted.

<Moisture Barrier Layer>

As the moisture barrier layer 60, a similar one to the moisture barrier layer 60 of the wavelength converter 1D according to the fourth embodiment is used. Therefore, a description of the moisture barrier layer 60 will be omitted.

The wavelength converter 1E according to the fifth embodiment corresponds to one in which the wavelength converter 1C according to the third embodiment, which includes the light reflecting film 12 and the protective film 13, and the moisture barrier layer 60 of the wavelength converter 1D according to the fourth embodiment are combined with each other.

<Manufacturing Method>

For example, the wavelength converter 1E can be manufactured in such a manner that, after the wavelength converter 1C according to the third embodiment is obtained by the above-described manufacturing method, the moisture barrier layer 60 is formed on the surface of the optical conversion layer 30C of the wavelength converter 1C by a well-known method.

<Functions of Fifth Embodiment>

The wavelength converter 1E according to the fifth embodiment corresponds to the one in which the wavelength converter 1C according to the third embodiment, which includes the light reflecting film 12 and the protective film 13, and the moisture barrier layer 60 of the wavelength converter 1D according to the fourth embodiment are combined with each other. Therefore, the wavelength converter 1E according to the fifth embodiment exhibits the functions of the wavelength converter 1C according to the third embodiment and the functions of the wavelength converter 1D according to the fourth embodiment.

<Effects of Fifth Embodiment>

The wavelength converter 1E according to the fifth embodiment exerts at least a similar effect to that of the wavelength converter 1A according to the first embodiment. Moreover, like the wavelength converter 1C according to the third embodiment, the wavelength converter 1E according to the fifth embodiment can increase the output of the fluorescence in comparison with the wavelength converter 1A according to the first embodiment. Moreover, like the wavelength converter 1D according to the fourth embodiment, the wavelength converter 1E according to the fifth embodiment can improve the water resistance of the surface of the optical conversion layer 30E in comparison with the wavelength converter 1A according to the first embodiment.

Sixth Embodiment

Figure 8:
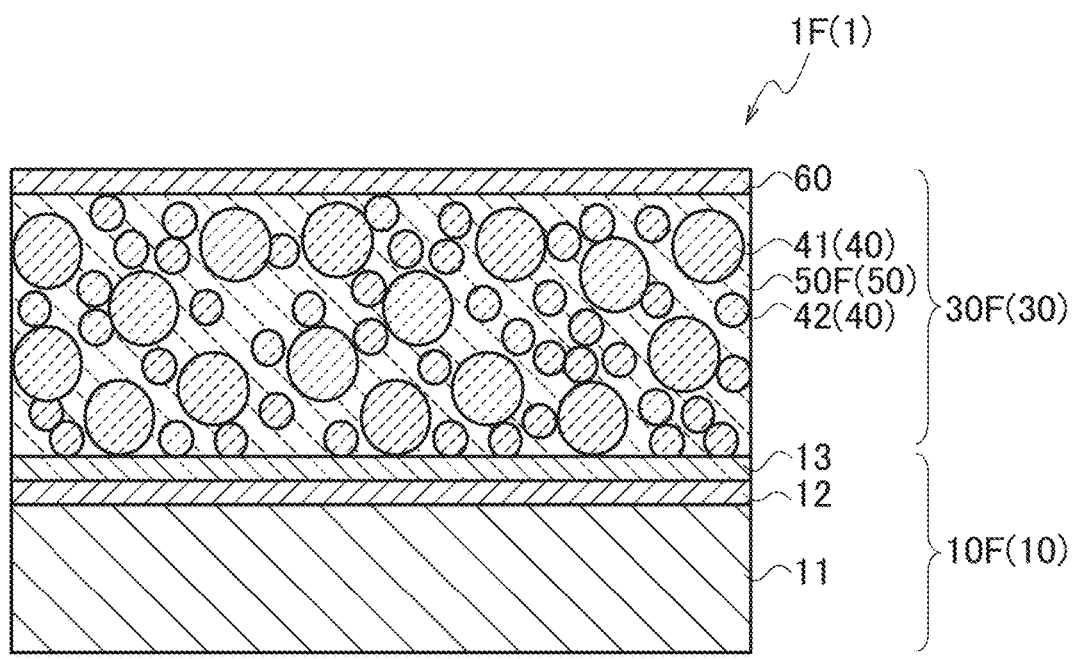
FIG. 8 is a schematic cross-sectional view of a wavelength converter according to a sixth embodiment.

FIG. 8 is a schematic cross-sectional view of a wavelength converter according to a sixth embodiment. As illustrated in FIG. 8, a wavelength converter 1F according to the sixth embodiment includes a substrate portion 10F (10), an optical conversion layer 30F (30) formed on the substrate portion 10F, and a moisture barrier layer 60 formed on the optical conversion layer 30F.

In comparison with the wavelength converter 1A according to the first embodiment, the wavelength converter 1F according to the sixth embodiment is one provided with the substrate portion 10F and the optical conversion layer 30F in place of the substrate portion 10A and the optical conversion layer 30A, respectively, and further provided with the moisture barrier layer 60. The same reference numerals are assigned to the same constituents between the wavelength converter 1F according to the sixth embodiment and the wavelength converter 1A according to the first embodiment, and a description of configurations and functions thereof will be omitted or simplified.

<Substrate Portion>

The substrate portion 10F includes a substrate body 11, a light reflecting film 12 laminated on a surface of the substrate body 11, and a protective film 13 laminated on a surface of the light reflecting film 12. The substrate portion 10F is the same as the substrate portion 10C of the wavelength converter 1C according to the third embodiment, and accordingly, a description thereof will be omitted.

<Optical Conversion Layer>

As the optical conversion layer 30F, a similar one to the optical conversion layer 30B of the wavelength converter 1B according to the second embodiment is used. Therefore, a description of the optical conversion layer 30F will be omitted.

<Moisture Barrier Layer>

As the moisture barrier layer 60, a similar one to the moisture barrier layer 60 of the wavelength converter 1D according to the fourth embodiment is used. Therefore, a description of the moisture barrier layer 60 will be omitted.

The wavelength converter 1F according to the sixth embodiment is the wavelength converter 1E according to the fifth embodiment, which is provided with the optical conversion layer 30F in place of the optical conversion layer 30E. Herein, the wavelength converter 1E according to the fifth embodiment corresponds to the one in which the wavelength converter 1C according to the third embodiment, which includes the light reflecting film 12 and the protective film 13, and the moisture barrier layer 60 of the wavelength converter 1D according to the fourth embodiment are combined with each other. Moreover, the optical conversion layer 30F is a similar one to the optical conversion layer 30B of the wavelength converter 1B according to the second embodiment.

Therefore, the wavelength converter 1F according to the sixth embodiment corresponds to one in which the wavelength converter 1B according to the second embodiment, the wavelength converter 1C according to the third embodiment, and the wavelength converter 1D according to the fourth embodiment are combined with one another.

<Manufacturing Method>

For example, the wavelength converter 1F can be manufactured by combining the manufacturing method of the wavelength converter 1B according to the second embodiment, the manufacturing method of the wavelength converter 1C according to the third embodiment, and the manufacturing method of the wavelength converter 1D according to the fourth embodiment with one another.

<Functions of Sixth Embodiment>

The wavelength converter 1F according to the sixth embodiment corresponds to the one in which the wavelength converter 1B according to the second embodiment, the wavelength converter 1C according to the third embodiment, and the wavelength converter 1D according to the fourth embodiment are combined with one another. Therefore, the wavelength converter 1F according to the sixth embodiment exhibits the functions of the wavelength converter 1B according to the second embodiment, the functions of the wavelength converter 1C according to the third embodiment, and the wavelength converter 1D according to the fourth embodiment.

<Effects of Sixth Embodiment>

The wavelength converter 1F according to the sixth embodiment exerts at least a similar effect to that of the wavelength converter 1A according to the first embodiment. Moreover, like the wavelength converter 1B according to the second embodiment, the wavelength converter 1F according to the sixth embodiment can increase the output of the fluorescence in comparison with the wavelength converter 1A according to the first embodiment. Furthermore, like the wavelength converter 1C according to the third embodiment, the wavelength converter 1F according to the sixth embodiment can increase the output of the fluorescence in comparison with the wavelength converter 1A according to the first embodiment. Moreover, like the wavelength converter 1D according to the fourth embodiment, the wavelength converter 1F according to the sixth embodiment can improve the water resistance of the surface of the optical conversion layer 30F in comparison with the wavelength converter 1A according to the first embodiment.

(Modified Examples of Second to Sixth Embodiments)

In the wavelength converter 1B according to the second embodiment to the wavelength converter 1F according to the sixth embodiment, modes are described, in each of which substances are not particularly included in the inter-inorganic-material-particle air gaps 55 formed in the inorganic polycrystalline substance 52 of the binder portion 50A. In contrast, as modified examples of the wavelength converters 1B to 1F according to these embodiments, like the first modified example, there can be used wavelength converters in modes in which in-air-gap inorganic material portions are included in the inter-inorganic-material-particle air gaps 55 formed in binder portions 50B to 50F. These modified examples are called second to sixth modified examples.

<Manufacturing Method>

Wavelength converters according to the second to sixth modified examples are obtained by forming the optical conversion layers 30 according to the second to sixth modified examples on the surfaces of the substrate portions 10B to 10F. For example, the optical conversion layer 30 according to the second modified example is obtained by mounting the substrate portion 10B into a metal mold, supplying the substrate portion 10B with a mixture of the optical conversion inorganic particles 40, the raw material powder of the binder portion 50, the dilute acid and the raw material powder of the in-air-gap inorganic material portion, and sintering the mixture at a low temperature while pressurizing the mixture. The optical conversion layers 30 according to the third to sixth modified examples are obtained by using the substrate portions 10C to 10F, respectively in place of the substrate portion 10B in the manufacturing method of the optical conversion layer 30 according to the second modified example.

<Functions of Second to Sixth Modified Examples>

Respective functions of the wavelength converters according to the second to sixth modified examples are the same as the respective functions of the wavelength converters 1B to 1F according to the second to sixth embodiments except for functions brought by the fact that the in-air-gap inorganic material portions are included in the inter-inorganic-material-particle air gaps 55 of the binder portions 50B to 50F.

The functions brought by the fact that the in-air-gap inorganic material portions are included in the respective inter-inorganic-material-particle air gaps 55 of the binder portions 50B to 50F are equal to a function in which the wavelength converter according to the above-described first modified example is different from the wavelength converter 1A according to the first embodiment. That is, in each of the wavelength converters according to the second to sixth modified examples, the in-air-gap inorganic material portion is included in the inter-inorganic-material-particle air gaps 55, and accordingly, the heat conduction in the inter-inorganic-material-particle air gaps 55 becomes larger than in each of the wavelength converters 1B to 1F according to the second to sixth embodiments. Therefore, in comparison with each of the wavelength converters 1B to 1F according to the second to sixth embodiments, each of the wavelength converters according to the second to sixth modified examples achieves higher thermal conductivity of the binder portion 50.

<Effects of Second to Sixth Modified Examples>

Each of the wavelength converters according to the second to sixth modified examples exerts at least a similar effect to that of each of the wavelength converters 1B to 1F according to the second to sixth embodiments. Moreover, in comparison with each of the wavelength converters 1B to 1F according to the second to sixth embodiments, each of the wavelength converters according to the second to sixth modified examples achieves higher thermal conductivity of the binder portion 50.

EXAMPLES

Hereinafter, this embodiment will be described more in detail by examples; however, this embodiment is not limited to these examples.

Example 1

(Fabrication of Wavelength Converter)

The wavelength converter 1A illustrated in FIG. 1 was fabricated.

<Substrate Portion>

As the substrate portion 10A, an aluminum substrate with a thickness of 0.7 mm was prepared.

<Raw Material of Optical Conversion Inorganic Particle>

As the optical conversion inorganic particles 40, YAG particles (produced by Nemoto Lumi Material Co., Ltd.) with an average particle size of 20 μm, which are yellow green phosphor, were prepared.

<Raw Material of Binder Portion>

As the raw material of the binder portion 50A, zinc oxide ZnO powder (average particle size: 500 nm) was prepared. FIG. 9 shows an example of a scanning electron microscope (SEM) picture of this zinc oxide powder 250. As shown in FIG. 9, it is understood that the zinc oxide powder 250 is formed into the inorganic material particles 251 in which a particle size ranges from 100 nm to 500 nm and ridge lines and lines which constitute corner portions are clear.

<Fabrication of Optical Conversion Layer>

First, the optical conversion inorganic particles 40 of 1 g, the zinc oxide powder 250 of 1 g, and a dilute acid of 0.4 ml were mixed together, and a slurry liked mixture was prepared. Next, an aluminum substrate was mounted into a metal mold made of stainless steel, and thereafter, the above-described mixture was applied onto the aluminum substrate. Moreover, a temperature inside the metal mold was set to 100° C., and the metal mold was pressed at 400 MPa by using a hand press machine, and was held as it was for one hour. When the metal mold was released from being pressed and was radiationally cooled to room temperature, a wavelength converter in which an optical conversion layer was formed on the aluminum substrate was obtained.

The obtained wavelength converter was the wavelength converter 1A in which the optical conversion layer 30A was formed on the substrate portion 10A composed of the aluminum substrate as illustrated in FIG. 1. Moreover, the optical conversion layer 30A included the optical conversion inorganic particles 40 and the binder portion 50A that mutually held the optical conversion inorganic particles 40.

(Fabrication of Zinc Oxide Pellet)

In order to investigate a microstructure of the binder portion 50A of the obtained wavelength converter 1A, columnar zinc oxide pellets which were composed of only the binder portion 50A and did not include the optical conversion inorganic particles 40 were fabricated separately.

First, the zinc oxide powder 250 of 1 g and the dilute acid of 0.2 ml were mixed together, and a slurry liked mixture was prepared. Next, the above-described mixture was charged into a metal mold made of stainless steel. Moreover, a temperature inside the metal mold was set to 100° C., and the metal mold was pressed at 400 MPa by using a hand press machine, and was held as it was for one hour. When the metal mold was released from being pressed and was radiationally cooled to room temperature, columnar zinc oxide pellets in each of which a height was smaller than a diameter were obtained. The obtained zinc oxide pellets were those corresponding to the binder portion 50A of the wavelength converter 1A, and accordingly, were denoted by reference numeral 50A like the binder portion.

(Evaluation of Zinc Oxide Pellet)

A variety of evaluations were performed for the obtained zinc oxide pellets.

<Measurement of Relative Density>

For the zinc oxide pellets, a mass thereof was measured by an electronic balance, and a thickness thereof was measured by a dial gauge. A relative density of the zinc oxide pellets was measured by using the mass, a volume and a density (5.61 g/cm$^3$) of a bulk of zinc oxide. The relative density was 80%.

<Measurement of Thermal Conductivity>

First, a thermal diffusion coefficient was measured by using a thermal diffusion rate evaluation device. Thermal conductivity was calculated by using the obtained thermal diffusion coefficient, specific heat and the above-described relative density. The thermal conductivity was 6.1 W/mK.

<Microscopy>

The columnar zinc oxide pellets 50A were broken so that a facture surface was formed along a height direction thereof, and the obtained fracture surface was observed by a scanning electron microscope (SEM). FIG. 2 is an example of the scanning electron microscope (SEM) picture showing a fracture surface of a binder portion (zinc oxide pellet) 50A of the wavelength converter 1A according to the above-described first embodiment and Example 1.

As shown in FIG. 2, it is understood that the binder portion (zinc oxide pellet) 50A contains, as a main component, the inorganic polycrystalline substance 52 composed in such a manner that the inorganic material particles 51 having an average particle size of 1 μm or less are bound to one another. Furthermore, it is understood that, in the inorganic polycrystalline substance 52 of Example 1, the inorganic material particles 51 and 51 densely bond to each other, the number of inter-inorganic-material-particle air gaps 55 which are air gaps between the inorganic material particles 51 and 51 which constitute the inorganic polycrystalline substance 52 is small, and a depth of the inter-inorganic-material-particle air gaps 55 is also small. Moreover, it is understood that, in the inorganic polycrystalline substance 52 that constitutes the binder portion (zinc oxide pellets) 50A, the ridge lines and corner portions thereof are rounded in a large number of the inorganic material particles 51, and the ridge lines and lines which constitute the corner portions are not clear.

Comparative Example 1

(Fabrication of Wavelength Converter)

The wavelength converter 100 illustrated in FIG. 1 was fabricated.

A wavelength converter 100 was fabricated in a similar way to Example 1 except that ion exchange water of 0.4 ml was used in place of the dilute acid of 0.4 ml in <Fabrication of optical conversion layer> of Example 1.

The obtained wavelength converter was such a wavelength converter 100 in which an optical conversion layer 130 was formed on the substrate portion 10A composed of the aluminum substrate as illustrated in FIG. 1. Moreover, the optical conversion layer 130 included the optical conversion inorganic particles 40 and the binder portion 150 that mutually held the optical conversion inorganic particles 40.

(Fabrication of Zinc Oxide Pellet)

In order to investigate a microstructure of the binder portion 150 of the obtained wavelength converter 100, columnar zinc oxide pellets which were composed of only the binder portion 150 and did not include the optical conversion inorganic particles 40 were fabricated separately.

Columnar zinc oxide pellets in which a height was smaller than a diameter were obtained in a similar way to Example 1 except that ion exchange water of 0.2 ml was used in place of the dilute acid of 0.2 ml in (Fabrication of zinc oxide pellet) on Example 1. The obtained zinc oxide pellets were those corresponding to the binder portion 150 of the wavelength converter 100, and accordingly, were denoted by reference numeral 150 like the binder portion.

(Evaluation of Zinc Oxide Pellet)

A variety of evaluations were performed for the obtained zinc oxide pellets.

<Measurement of Relative Density>

A relative density was measured for the zinc oxide pellets in a similar way to Example 1. The relative density was 68%.

<Measurement of Thermal Conductivity>

A thermal conductivity was measured for the zinc oxide pellets in a similar way to Example 1. The thermal conductivity was 1.5 W/mK.

<Microscopy>

The columnar zinc oxide pellets 50A were broken so that a facture surface was formed along a height direction thereof, and the obtained fracture surface was observed by a scanning electron microscope (SEM). FIG. 10 is an example of a scanning electron microscope (SEM) picture showing a fracture surface of the binder portion (zinc oxide pellet) 150 of the wavelength converter 100 of Comparative example 1.

As shown in FIG. 10, it is understood that the binder portion (zinc oxide pellet) 150 of the wavelength converter of Comparative example 1 contains, as a main component, the inorganic polycrystalline substance 152 composed in such a manner that the inorganic material particles 151 are bound to one another. Moreover, it is understood that a size of the inorganic material particles 151 of the inorganic polycrystalline substance 152 of Comparative example 1 is larger than that of the inorganic material particles 51 of the inorganic polycrystalline substance 52 in Example 1. Furthermore, it is understood that, in the inorganic polycrystalline substance 152 of Comparative example 1, the inorganic material particles 151 and 151 thinly bond to each other. Moreover, it is understood that, in Comparative example 1, the number of inter-inorganic-material-particle air gaps 55 which are air gaps between the inorganic material particles 151 and 151 which constitute the inorganic polycrystalline substance 152 is extremely large, and a depth of the inter-inorganic-material-particle air gaps 55 is also large. Furthermore, it is understood that, in the conventional inorganic polycrystalline substance 152 of Comparative example 1, the ridge lines and the lines which constitute the corner portions are clear in a large number of the inorganic material particles 151.

Evaluation Comparison Between Example 1 and Comparative Example 1

It is understood that, in the inorganic polycrystalline substance 52 of the binder portion (zinc oxide pellets) 50A of Example 1, the relative density and the thermal conductivity are larger than in the inorganic polycrystalline substance 152 of the binder portion (zinc oxide pellets) 150 of Comparative example 1. Moreover, it is understood that, in the inorganic polycrystalline substance 52 of Example 1, the ridge lines and the corner portions are rounded and the ridge lines and the lines which constitute the corner portions are not clear in a large number of the inorganic material particles 51 in comparison with the inorganic polycrystalline substance 152 of Comparative example 1. Furthermore, it is understood that, in the inorganic polycrystalline substance 52 of Example 1, the number of inter-inorganic-material-particle air gaps 55 is smaller and the depth of the inter-inorganic-material-particle air gaps 55 is also smaller than in the inorganic polycrystalline substance 152 of Comparative example 1.

The entire contents of Japanese Patent Application No. 2017-202624 (filed on: Oct. 19, 2017) are incorporated herein by reference.

Although the contents of this embodiment have been described above in accordance with the examples, it is obvious to those skilled in the art that this embodiment is not limited to the description of these and that various modifications and improvements are possible.

INDUSTRIAL APPLICABILITY

In accordance with the present disclosure, the wavelength converter is obtained, in which thermal conductivity is high and light scatters largely.

REFERENCE SIGNS LIST 1, 1A, 1B, 1C, 1D, 1E, 1F, 100 WAVELENGTH CONVERTER
10, 10A, 10B, 10C, 10D, 10E, 10F SUBSTRATE PORTION
11 SUBSTRATE BODY
12 LIGHT REFLECTING FILM
13 PROTECTIVE FILM
30, 30A, 30B, 30C, 30D, 30E, 30F, 130 OPTICAL CONVERSION LAYER
40 OPTICAL CONVERSION INORGANIC PARTICLE
41 OPTICAL CONVERSION INORGANIC PARTICLE WITH LARGE PARTICLE SIZE
42 OPTICAL CONVERSION INORGANIC PARTICLE WITH SMALL PARTICLE SIZE
50, 50A, 50B, 50C, 50D, 50E, 50F, 150 BINDER PORTION (ZINC OXIDE PELLET)
51 INORGANIC MATERIAL PARTICLES (INORGANIC MATERIAL PARTICLES OF DILUTE-ACID PRESSED INORGANIC SINTERED BODY)
52 DILUTE-ACID PRESSED INORGANIC SINTERED BODY (INORGANIC POLYCRYSTALLINE SUBSTANCE)
55 INTER-INORGANIC-MATERIAL-PARTICLE AIR GAP
60 MOISTURE BARRIER LAYER
151 INORGANIC MATERIAL PARTICLES (INORGANIC MATERIAL PARTICLES OF WATER-PRESSED INORGANIC SINTERED BODY)
152 WATER-PRESSED INORGANIC SINTERED BODY (INORGANIC POLYCRYSTALLINE SUBSTANCE)
250 ZINC OXIDE POWDER
251 INORGANIC MATERIAL PARTICLES (INORGANIC MATERIAL PARTICLES OF ZINC OXIDE POWDER)

The invention claimed is:

1. A wavelength converter comprising:
a substrate portion; and
an optical conversion layer including optical conversion inorganic particles and a binder portion that mutually holds the optical conversion inorganic particles, and being formed on the substrate portion,
wherein the substrate portion and the binder portion bond to each other,
wherein the binder portion includes, as a main component, an inorganic polycrystalline substance composed in such a manner that inorganic material particles having an average particle size of 1 μm or less are bound to one another, and has thermal conductivity of 2 w/mK or more,
wherein the inorganic polycrystalline substance includes inter-inorganic-material-particle air gaps between the inorganic material particles which constitute the inorganic polycrystalline substance, and
wherein the binder portion further includes an in-air-gap inorganic material portion in the inter-inorganic-material-particle air gaps, the in-air-gap inorganic material portion being composed of inorganic crystal having a particle equivalent radius of 10 nm or less.

2. The wavelength converter according to claim 1,
wherein the inorganic polycrystalline substance is a dilute-acid pressed inorganic sintered body, and
wherein, in the substrate portion and the binder portion, the substrate portion and the dilute-acid pressed inorganic sintered body in the binder portion directly bond to each other in at least a part of an interface between the substrate portion and the binder portion.

3. The wavelength converter according to claim 1, wherein a reflectance of a surface of the substrate portion, the surface being closer to the optical conversion layer, is 90% or more.

4. The wavelength converter according to claim 1, wherein the optical conversion inorganic particles include a nitride-based optical conversion material activated by $Eu^{2+}$.

5. The wavelength converter according to claim 1, wherein the binder portion includes a metal oxide.

6. The wavelength converter according to claim 5, wherein the metal oxide is zinc oxide or magnesium oxide.

7. The wavelength converter according to claim 1, wherein the substrate portion is made of metal.

8. The wavelength converter according to claim 1, further comprising a moisture barrier layer that covers a surface of the optical conversion layer, the surface being remote from the substrate portion.

9. A wavelength converter comprising:
a substrate portion; and
an optical conversion layer including optical conversion inorganic particles and a binder portion that mutually holds the optical conversion inorganic particles, and being formed on the substrate portion,
wherein the substrate portion and the binder portion bond to each other,
wherein the binder portion includes, as a main component, an inorganic polycrystalline substance composed in such a manner that inorganic material particles having an average particle size of 1 μm or less are bound to one another, and has thermal conductivity of 2 w/mK or more,
wherein the inorganic polycrystalline substance is a dilute-acid pressed inorganic sintered body, and
wherein, in the substrate portion and the binder portion, the substrate portion and the dilute-acid pressed inorganic sintered body in the binder portion directly bond to each other in at least a part of an interface between the substrate portion and the binder portion.

10. A wavelength converter comprising:
a substrate portion; and
an optical conversion layer including optical conversion inorganic particles and a binder portion that mutually holds the optical conversion inorganic particles, and being formed on the substrate portion,
wherein the substrate portion and the binder portion bond to each other,
wherein the binder portion includes, as a main component, an inorganic polycrystalline substance composed in such a manner that inorganic material particles having an average particle size of 1 μm or less are bound to one another, and has thermal conductivity of 2 w/mK or more, and
wherein the binder portion includes a metal oxide, and
wherein the metal oxide is zinc oxide or magnesium oxide.

* * * * *